(12) United States Patent
Hsu (10) Patent No.: US 10,038,043 B2
(45) Date of Patent: Jul. 31, 2018

(54) METHOD FOR MANUFACTURING AMOLED BACKPLANE AND STRUCTURE THEREOF (71) Applicant: Shenzhen China Star Optoelectronics Technology Co., Ltd., Shenzhen (CN)

(72) Inventor: Yuanjun Hsu, Shenzhen (CN)

(73) Assignee: SHENZHEN CHINA STAR OPTOELECTRONICS TECHNOLOGY CO., LTD., Shenzhen, Guangdong (CN)

(*) Notice: Subject to any disclaimer, the term of this patent is extended or adjusted under 35 U.S.C. 154(b) by 400 days.

(21) Appl. No.: 14/764,164

(22) PCT Filed: Jun. 18, 2015

(86) PCT No.: PCT/CN2015/081722
§ 371 (c)(1),
(2) Date: Jul. 28, 2015

(87) PCT Pub. No.: WO2016/176893
PCT Pub. Date: Nov. 10, 2016

(65) Prior Publication Data
US 2017/0133446 A1   May 11, 2017

(30) Foreign Application Priority Data
May 7, 2015  (CN) .......................... 2015 1 0230419

(51) Int. Cl.
*H01L 27/32* (2006.01)
*H01L 21/02* (2006.01)
(Continued)

(52) U.S. Cl.
CPC .... *H01L 27/3262* (2013.01); *H01L 21/02532* (2013.01); *H01L 21/02592* (2013.01);
(Continued)

(58) Field of Classification Search
CPC ........................ H01L 27/3258; H01L 27/3265
See application file for complete search history.

(56) References Cited

U.S. PATENT DOCUMENTS

2008/0277666 A1    11/2008  Jeon et al.
2013/0280868 A1*   10/2013  Chen ................. H01L 29/66757
                                                            438/166
2016/0111677 A1*    4/2016  Hong ................... H01L 51/5246
                                                            257/40

FOREIGN PATENT DOCUMENTS

CN    101577283 A    11/2009
CN    104143533 A    11/2014
CN    104538429 A     4/2015

* cited by examiner

*Primary Examiner* — Michael Lebentritt
*Assistant Examiner* — Suberr Chi
(74) *Attorney, Agent, or Firm* — Leong C. Lei (57) ABSTRACT

The present invention provides method for manufacturing an AMOLED backplane and a structure thereof. The method uses a drain terminal of a drive TFT to serve as an anode of AMOLED the anode, so that compared to the prior art, the steps of forming a planarization layer and an anode layer are eliminated and also, the same half-tone masking operation is used to form a pixel definition layer and photo spacers, whereby the method for manufacturing the AMOLED backplane according to the present invention requires only six masking operations and saves three masking operations compared to the prior art, thereby effectively simplifying the manufacturing process, improving manufacturing efficiency, and saving cost. The present invention provides a structure of an AMOLED backplane, which has a simple structure, is easy to manufacture, and has a low cost.

11 Claims, 8 Drawing Sheets

(51) Int. Cl.
  *H01L 51/52*     (2006.01)
  *H01L 29/167*    (2006.01)
  *H01L 21/265*    (2006.01)
  *H01L 29/66*     (2006.01)
  *H01L 29/786*    (2006.01)
  *H01L 29/45*     (2006.01)
  *H01L 27/12*         (2006.01)
  *H01L 29/51*         (2006.01)
  *H01L 29/49*         (2006.01)

(52) U.S. Cl.
  CPC .. *H01L 21/02667* (2013.01); *H01L 21/26513*
    (2013.01); *H01L 27/3248* (2013.01); ***H01L
    27/3258* (2013.01); *H01L 27/3265*** (2013.01);
    *H01L 29/167* (2013.01); *H01L 29/456*
    (2013.01); *H01L 29/66757* (2013.01); ***H01L
    29/78675* (2013.01); *H01L 51/5206*** (2013.01);
    *H01L 27/1222* (2013.01); *H01L 27/1248*
    (2013.01); *H01L 27/1274* (2013.01); *H01L
    27/1288* (2013.01); *H01L 29/4908* (2013.01);
    *H01L 29/51* (2013.01); *H01L 29/511*
    (2013.01); *H01L 29/518* (2013.01); *H01L
    2227/323* (2013.01)

(Prior Art)

METHOD FOR MANUFACTURING AMOLED BACKPLANE AND STRUCTURE THEREOF

BACKGROUND OF THE INVENTION

1. Field of the Invention

The present invention relates to the field of display technology, and in particular to a method for manufacturing an active matrix organic light emitting diode (AMOLED) backplane and a structure thereof.

2. The Related Arts

In the field of display technology, the flat panel display technology, including liquid crystal display (LCD) and organic light emitting diode (OLED), has gradually taken the place of cathode ray tube (CRT) displays. Among them, OLED has various advantages, including self-luminous, low drive voltage, high emission efficiency, short response time, high sharpness and contrast, approximately 180 degree view angle, wide range of operation temperature, and being capable of achieving flexible displaying and large-area full-color displaying, and is widely used in for example mobile phone screens, computer displays, and full-color televisions and are considered a display device of the most prosperous development.

According to the types of driving, OLEDs can be classified as passive OLEDs (such as PMIOLEDs) and active OLEDs (such as AMOLEDs). An AMOLDE is a self-luminous device composed of a low temperature poly-silicon (LTPS) driving backplane and an electroluminescent layer. The LTPS possesses relatively high electron mobility and for an AMOLED, which involves the LTPS material, various advantages, such as high resolution, high response speed, high brightness, high aperture ratio, and low power consumption, can be achieved.

Figure 1:
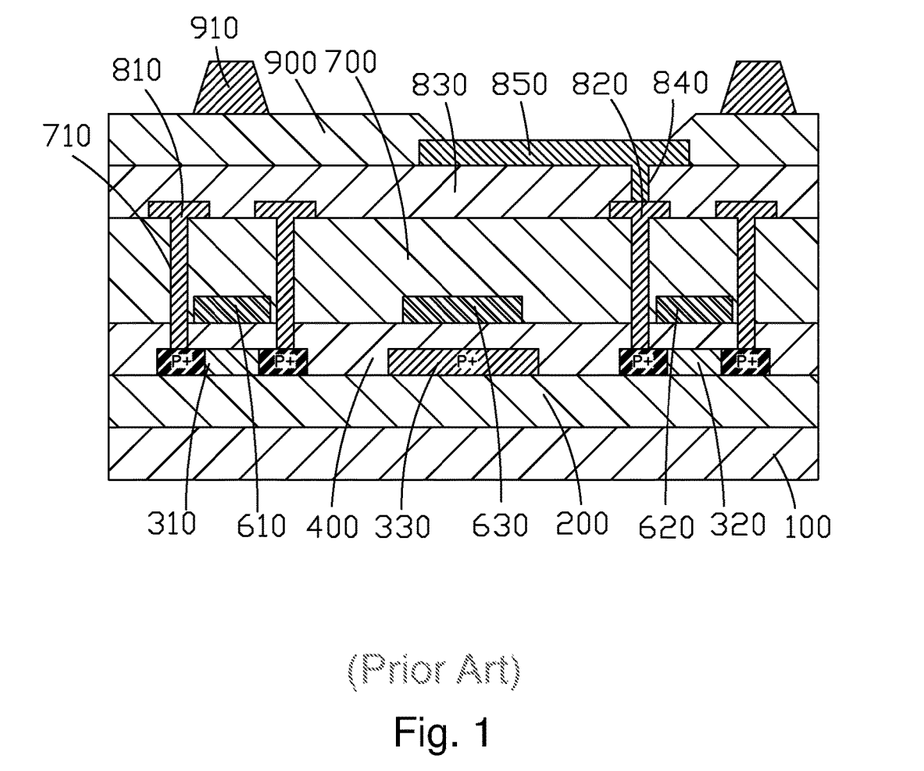
FIG. 1 is a cross-sectional view showing a conventional active matrix organic light emitting diode (AMOLED) backplane.

FIG. 1 is a cross-sectional view showing a conventional active matrix organic light emitting diode (AMOLED) backplane. A method for manufacturing the AMOLED backplane generally comprises the following steps:

Step 1: providing a substrate 100, wherein the substrate 100 comprises a switch thin-film transistor (TFT) zone, a storage capacitor zone, and a drive TFT zone, and depositing a buffer layer 200 on the substrate 100;

Step 2: depositing an amorphous silicon layer on the buffer layer 200, conducting a crystallization process to crystallize and convert the amorphous silicon layer into a poly-silicon layer, and conducting a masking operation to subject the poly-silicon layer to patternization so as to form a first poly-silicon section 310 located in the switch TFT zone, a second poly-silicon section 320 located in the drive TFT zone, and a third poly-silicon section 330 located in the storage capacitor zone;

Step 3: depositing a gate insulation layer 400 on the first poly-silicon section 310, the second poly-silicon section 320, the third poly-silicon section 330, and the buffer layer 200;

Step 4: depositing a first photoresist layer on the gate insulation layer 400 and conducting a masking operation to patternize the first photoresist layer, wherein the first photoresist layer shields middle portions of the first poly-silicon section 310 and the second poly-silicon section 320 but does not shield the third poly-silicon section 330; and with the first photoresist layer serving as a shielding layer, P-type heavy doping is applied to the first poly-silicon section 310, the second poly-silicon section 320, and the third poly-silicon section 330 so as to form P-type heavily doped zones respectively on two sides of each of the first poly-silicon section 310 and the second poly-silicon section 320 and the entirety of the third poly-silicon section 330;

Step 5: removing the first photoresist layer, depositing a first metal layer on the gate insulation layer 400, and conducting a masking operation to patternize the first metal layer so as to form a first gate terminal 610 in the switch TFT zone, a second gate terminal 620 in the drive TFT zone, and a metal electrode 630 in the storage capacitor zone;

Step 6: depositing an interlayer insulation layer 700 on the first gate terminal 610, the second gate terminal 620, the metal electrode 630, and the gate insulation layer 400 and conducting a masking operation to form first vias 710 in the interlayer insulation layer 700 and the gate insulation layer 400 to respectively correspond to the P-type heavily doped zones on the two sides of the first poly-silicon section 310 and those of the second poly-silicon section 320;

Step 7: depositing a second metal layer on the interlayer insulation layer 700 and conducting a masking operation to patternize the second metal layer so as to form first source/drain terminals 810 and second source/drain terminals 820, wherein the first source/drain terminals 810 and the second source/drain terminals 820 are respectively connected through the first vias 710 to the P-type heavily doped zones on the two sides of the first poly-silicon section 310 and those of the second poly-silicon section 320;

Step 8: forming a planarization layer 830 on the first source/drain terminals 810, the second source/drain terminals 820, and the interlayer insulation layer 700 and conducting a masking operation to form a second via 840 in the planarization layer 830 to correspond to the second source/drain terminals 820;

Step 9: depositing a conductive film on the planarization layer 830 and conducting a masking operation to patternize the conductive film so as to form an anode 850, wherein the anode 850 is connected through the second via 840 to the second source/drain terminals 820;

Step 10: depositing a second photoresist layer on the anode 850 and the planarization layer 830 and conducting a masking operation to patternize the second photoresist layer so as to form a pixel definition layer 900; and Step 11: depositing a third photoresist layer on the pixel definition layer 900 and the anode 850 and conducting a masking operation to patternize the third photoresist layer so as to form photo spacers 910.

Such a process requires nine masks and thus the process is complicated and has low manufacturing efficiency and high cost. Therefore, it is desired to provide a novel method for manufacturing an AMOLED backplane and a structure thereof that overcomes the above problems.

SUMMARY OF THE INVENTION

An object of the present invention is to provide a method for manufacturing an active matrix organic light emitting diode (AMOLED) backplane, which has a simple process, can increase manufacturing efficiency, and can save costs.

Another object of the present invention is to provide an AMOLED backplane structure, which has a simple structure, is easy to manufacture, and has a low cost.

To achieve the above objects, the present invention provides a method for manufacturing an AMOLED backplane, which comprises the following steps:

(1) providing a substrate, wherein the substrate comprises a switch thin-film transistor (TFT) zone, a storage capacitor zone, and a drive TFT zone, and depositing a buffer layer on the substrate;

(2) depositing an amorphous silicon layer on the buffer layer, conducting a crystallization process to crystallize and convert the amorphous silicon layer into a poly-silicon layer, and conducting a masking operation to subject the poly-silicon layer to patternization so as to form a first poly-silicon section located in the switch TFT zone, a second poly-silicon section located in the drive TFT zone, and a third poly-silicon section located in the storage capacitor zone;

(3) depositing a gate insulation layer on the first poly-silicon section, the second poly-silicon section, the third poly-silicon section, and the buffer layer;

(4) depositing a first photoresist layer on the gate insulation layer and conducting a masking operation to patternize the first photoresist layer so as to form a photoresist layer, wherein the photoresist layer shields middle portions of the first poly-silicon section and the second poly-silicon section but does not shield the third poly-silicon section, wherein with the photoresist layer serving as a shielding layer, P-type heavy doping is applied to the first poly-silicon section, the second poly-silicon section, and the third poly-silicon section so as to form P-type heavily doped zones respectively on two sides of each of the first poly-silicon section and the second poly-silicon section and the entirety of the third poly-silicon section;

(5) removing the photoresist layer, depositing a first metal layer on the gate insulation layer, and conducting a masking operation to patternize the first metal layer so as to form a first gate terminal in the switch TFT zone, a second gate terminal in the drive TFT zone, and a metal electrode in the storage capacitor zone;

(6) depositing an interlayer insulation layer on the first gate terminal, the second gate terminal, the metal electrode, and the gate insulation layer and conducting a masking operation to form first vias in the interlayer insulation layer and the gate insulation layer to respectively correspond to the P-type heavily doped zones on the two sides of the first poly-silicon section and those of the second poly-silicon section;

(7) depositing a conductive film on the interlayer insulation layer and conducting a masking operation to patternize the conductive film so as to form a first source terminal and a first drain terminal in the switch TFT zone and a second source terminal and a second drain terminal in the drive TFT zone, wherein the second drain terminal is extended to the storage capacitor zone and also serves as an anode of the AMOLED, wherein the first source terminal, the second drain terminal, the second source terminal, and the second drain terminal are respectively connected, through the first vias, to the P-type heavily doped zones on the two sides of the first poly-silicon section and those of the second poly-silicon section; and (8) sequentially depositing a second photoresist layer and a third photoresist layer on the first source terminal, the first drain terminal, the second source terminal, the second drain terminal, and the interlayer insulation layer and conducting a half-tone masking operation to simultaneously subject the second photoresist layer and the third photoresist layer to patternization so as to form a pixel definition layer and photo spacers, wherein the pixel definition layer comprises a second via formed therein to expose the second drain terminal.

In step (2), the crystallization process is performed with excimer laser annealing, solid phase crystallization, metal-induced crystallization, or metal-induced lateral crystallization.

In step (3), the gate insulation layer is formed of a silicon oxide layer, a silicon nitride layer, or a composite structure composed of silicon oxide layers and silicon nitride layers.

In step (5), an ion implantation machine is employ to implant boron ions to form the P-type heavily doped zones.

In step (7), the interlayer insulation layer is formed of a silicon oxide layer, a silicon nitride layer, or a composite structure composed of silicon oxide layers and silicon nitride layers.

In step (8), the conductive film, and thus the first source terminal, the first drain terminal, the second source terminal, and the second drain terminal, is of a three-layer structure comprising a metal layer sandwiched between two conductive oxide layers, the conductive oxide layers comprise a material of indium tin oxide, the metal layer comprises a material of silver or aluminum.

The present invention also provides a structure of an AMOLED backplane, which comprises a substrate, a buffer layer formed on the substrate, a first poly-silicon section, a second poly-silicon section, and a third poly-silicon section formed on the buffer layer and spaced from each other, a gate insulation layer formed on the first poly-silicon section, the second poly-silicon section, the third poly-silicon section, and the buffer layer, a first gate terminal, a second gate terminal, and a metal electrode formed on the gate insulation layer, an interlayer insulation layer formed on the first gate terminal, the second gate terminal, the metal electrode, and the gate insulation layer, a first source terminal, a second drain terminal, a second source terminal, and a second drain terminal formed on the interlayer insulation layer, a pixel definition layer formed on the first source terminal, the second drain terminal, the second source terminal, the second drain terminal, and the interlayer insulation layer, and photo spacers formed on the pixel definition layer;

wherein two sides of each the first poly-silicon section and the second poly-silicon section and the entirety of the third poly-silicon section are each formed with a P-type heavily doped zone;

wherein the interlayer insulation layer and the gate insulation layer comprise first vias formed therein to correspond to the P-type heavily doped zones of the two sides of the first poly-silicon section and the second poly-silicon section so that the first source terminal, the first drain terminal, the second source terminal, and the second drain terminal are respectively connected through the first vias to the P-type heavily doped zones of the two sides of the first poly-silicon section and the second poly-silicon section; and the pixel definition layer comprises a second via formed therein to correspond to the second drain terminal so as to expose the second drain terminal; and wherein the first poly-silicon section, the first gate terminal, the first source terminal, and the first drain terminal constitute a switch TFT; the second poly-silicon section, the second gate terminal, the second source terminal, and the second drain terminal constitute a drive TFT; and the third poly-silicon section and the metal electrode constitute a storage capacitor; and the second drain terminal serves as an anode of the AMOLED.

The gate insulation layer comprises a silicon oxide layer, a silicon nitride layer, or a composite structure composed of silicon oxide layers and silicon nitride layers.

The interlayer insulation layer comprises a silicon oxide layer, a silicon nitride layer, or a composite structure composed of silicon oxide layers and silicon nitride layers.

The first source terminal, the second drain terminal, the second source terminal, and the second drain terminal are each of three-layer structure comprising a metal layer sandwiched between two conductive oxide layers, the conductive oxide layers comprising a material of indium tin oxide, the metal layer comprising a material of silver or aluminum.

The present invention further provides a structure of an AMOLED backplane, which comprises a substrate, a buffer layer formed on the substrate, a first poly-silicon section, a second poly-silicon section, and a third poly-silicon section formed on the buffer layer and spaced from each other, a gate insulation layer formed on the first poly-silicon section, the second poly-silicon section, the third poly-silicon section, and the buffer layer, a first gate terminal, a second gate terminal, and a metal electrode formed on the gate insulation layer, an interlayer insulation layer formed on the first gate terminal, the second gate terminal, the metal electrode, and the gate insulation layer, a first source terminal, a first drain terminal, a second source terminal, and a second drain terminal formed on the interlayer insulation layer, a pixel definition layer formed on the first source terminal, the first drain terminal, the second source terminal, the second drain terminal, and the interlayer insulation layer, and photo spacers formed on the pixel definition layer;

wherein two sides of each the first poly-silicon section and the second poly-silicon section and the entirety of the third poly-silicon section are each formed with a P-type heavily doped zone;

wherein the interlayer insulation layer and the gate insulation layer comprise first vias formed therein to correspond to the P-type heavily doped zones of the two sides of the first poly-silicon section and the second poly-silicon section so that the first source terminal, the first drain terminal, the second source terminal, and the second drain terminal are respectively connected through the first vias to the P-type heavily doped zones of the two sides of the first poly-silicon section and the second poly-silicon section; and the pixel definition layer comprises a second via formed therein to correspond to the second drain terminal so as to expose the second drain terminal;

wherein the first poly-silicon section, the first gate terminal, the first source terminal, and the first drain terminal constitute a switch TFT; the second poly-silicon section, the second gate terminal, the second source terminal, and the second drain terminal constitute a drive TFT; and the third poly-silicon section and the metal electrode constitute a storage capacitor; and the second drain terminal serves as an anode of the AMOLED;

wherein the gate insulation layer comprises a silicon oxide layer, a silicon nitride layer, or a composite structure composed of silicon oxide layers and silicon nitride layers;

wherein the interlayer insulation layer comprises a silicon oxide layer, a silicon nitride layer, or a composite structure composed of silicon oxide layers and silicon nitride layers; and wherein the first source terminal, the first drain terminal, the second source terminal, and the second drain terminal are each of a three-layer structure comprising a metal layer sandwiched between two conductive oxide layers, the conductive oxide layers comprising a material of indium tin oxide, the metal layer comprising a material of silver or aluminum.

The efficacy of the present invention is that the present invention provides a method for manufacturing an AMOLED backplane, in which a drain terminal of a drive TFT also serves as an anode of the AMOLED, so that compared to the prior art, the steps of forming a planarization layer and an anode layer are eliminated and also, the same half-tone masking operation is used to form a pixel definition layer and photo spacers, whereby the method for manufacturing the AMOLED backplane according to the present invention requires only six masking operations and saves three masking operations compared to the prior art, thereby effectively simplifying the manufacturing process, improving manufacturing efficiency, and saving cost. The present invention provides a structure of an AMOLED backplane, which has a simple structure, is easy to manufacture, and has a low cost.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The technical solution, as well as other beneficial advantages, of the present invention will be apparent from the following detailed description of embodiments of the present invention, with reference to the attached drawing. In the drawing.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 2:
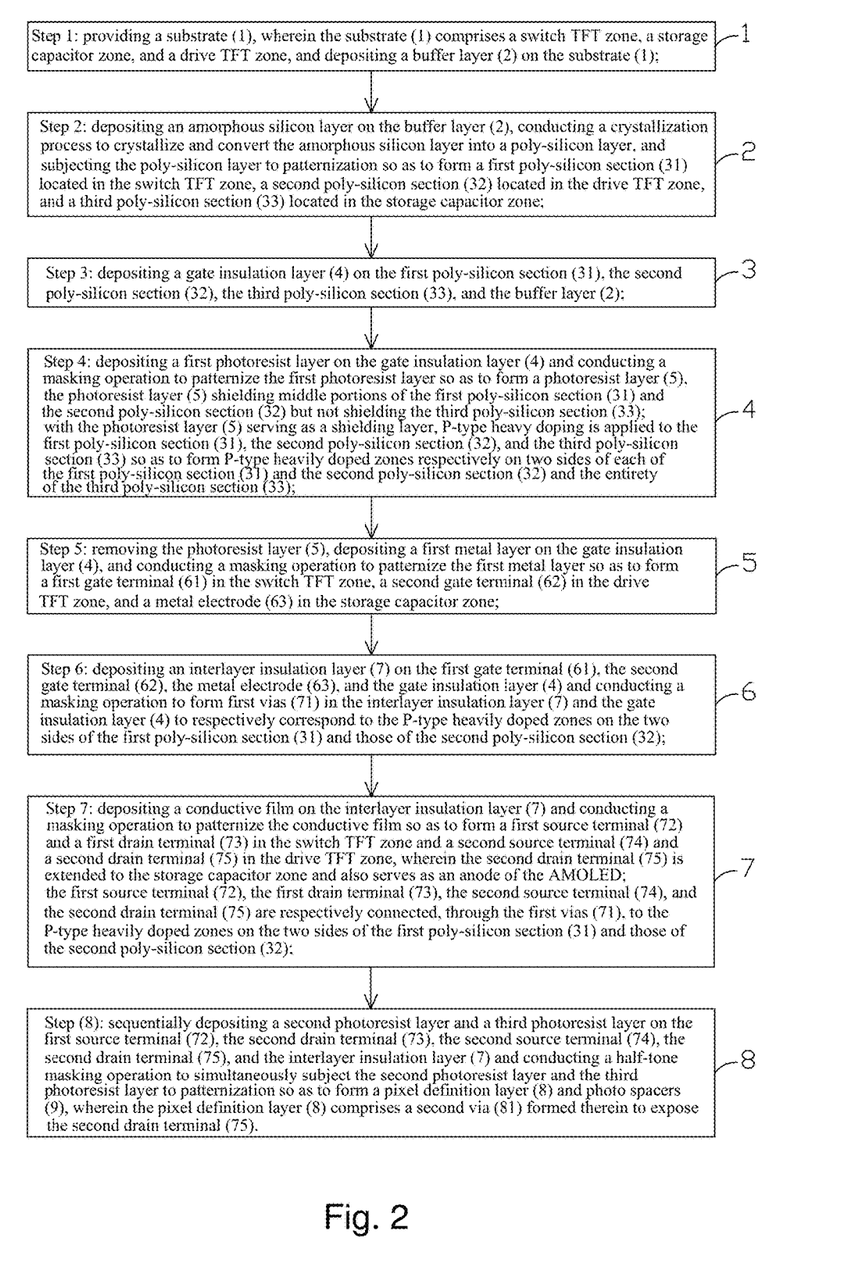
FIG. 2 is a flow chart illustrating a method for manufacturing an AMOLED backplane according to the present invention.
Figure 3:
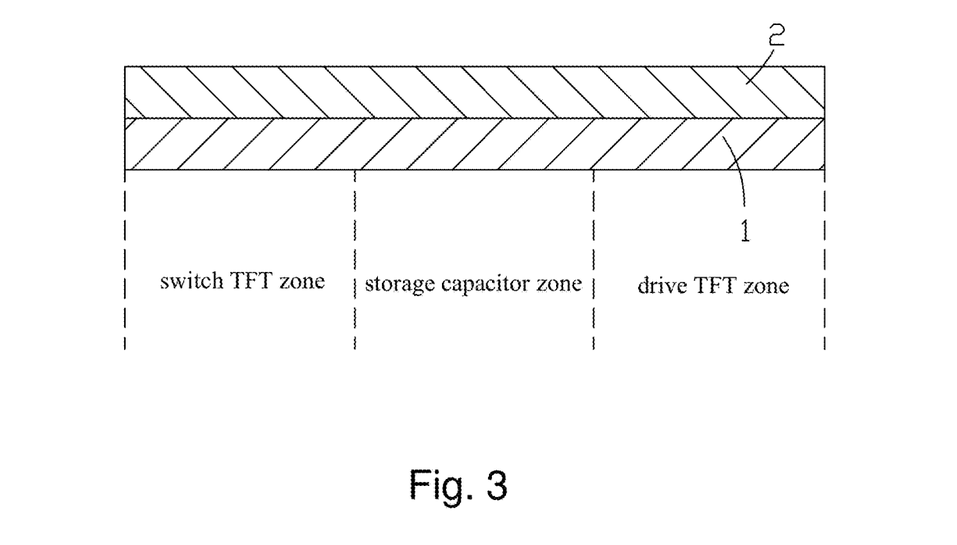
FIG. 3 is a schematic view illustrating a first step of the method for manufacturing the AMOLED backplane according to the present invention.

Referring to FIG. 2, the present invention provides a method for manufacturing an active matrix organic light emitting diode (AMOLED) backplane, which comprises the following steps:

Step 1: as shown in FIG. 3, providing a substrate 1, wherein the substrate 1 comprises a switch thin-film transistor (TFT) zone, a storage capacitor zone, and a drive TFT zone, and depositing a buffer layer 2 on the substrate 1.

Specifically, the buffer layer 2 is a silicon oxide layer, a silicon nitride layer, or a composite structure composed of silicon oxide layers and silicon nitride layers.

Figure 4:
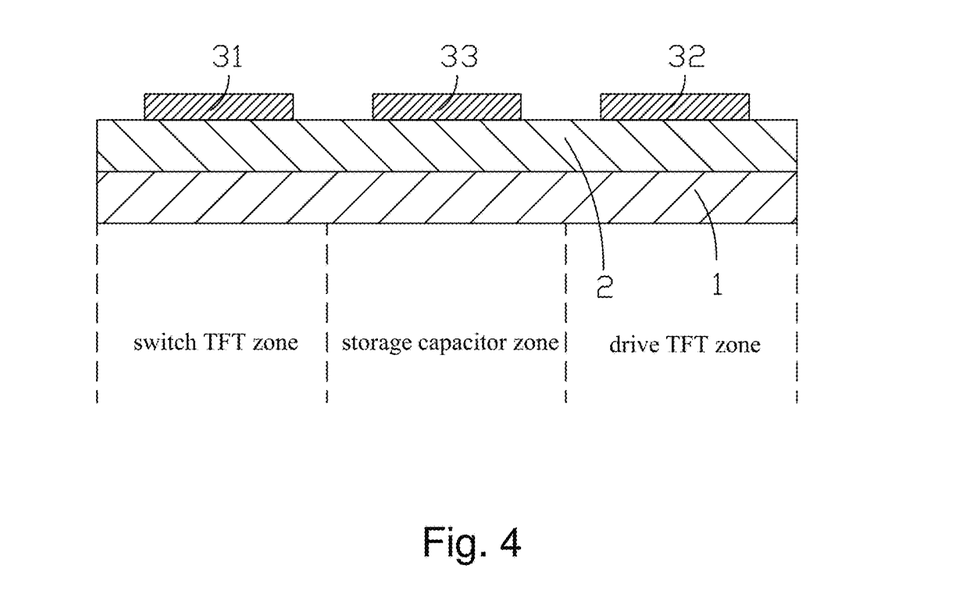
FIG. 4 is a schematic view illustrating a second step of the method for manufacturing the AMOLED backplane according to the present invention.

Step 2: as shown in FIG. 4, depositing an amorphous silicon layer on the buffer layer 2, conducting a crystallization process to crystallize and convert the amorphous silicon layer into a poly-silicon layer, and subjecting the poly-silicon layer to patternization so as to form a first poly-silicon section 31 located in the switch TFT zone, a second poly-silicon section 32 located in the drive TFT zone, and a third poly-silicon section 33 located in the storage capacitor zone.

Specifically, the third poly-silicon section 33 is located between the first poly-silicon section 31 and the second poly-silicon section 32.

Specifically, the crystallization process is conducted with excimer laser annealing (ELA), solid phase crystallization (SPC), metal-induced crystallization (MIC), or metal-induced lateral crystallization (MILC).

Figure 5:
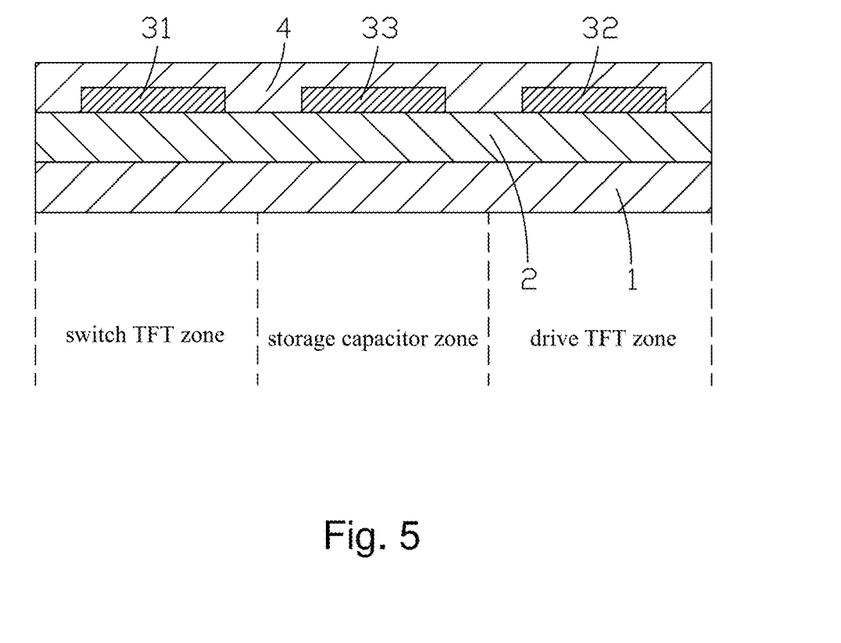
FIG. 5 is a schematic view illustrating a third step of the method for manufacturing the AMOLED backplane according to the present invention.

Step 3: as shown in FIG. 5, depositing a gate insulation layer 4 on the first poly-silicon section 31, the second poly-silicon section 32, the third poly-silicon section 33, and the buffer layer 2.

Specifically, the gate insulation layer 4 is a silicon oxide layer, a silicon nitride layer, or a composite structure composed of silicon oxide layers and silicon nitride layers.

Figure 6:
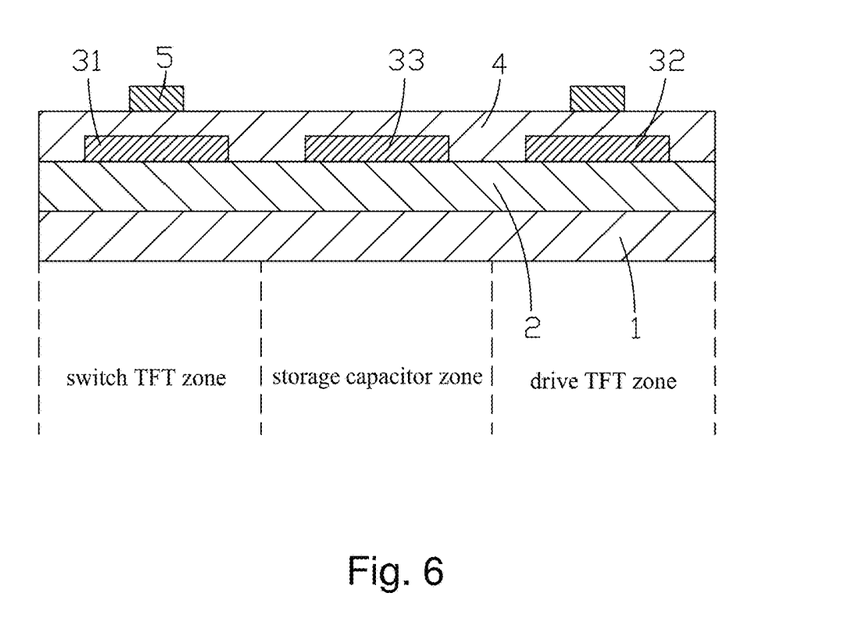
FIGS. 6 and 7 are schematic views illustrating a fourth step of the method for manufacturing the AMOLED backplane according to the present invention.

Step 4: as shown in FIG. 6, depositing a first photoresist layer on the gate insulation layer 4 and conducting a masking operation to patternize the first photoresist layer so as to form a photoresist layer 5.

The photoresist layer 5 shields middle portions of the first poly-silicon section 31 and the second poly-silicon section 32 but does not shield the third poly-silicon section 33, so that the photoresist layer 5 can be used to define areas where P-type heavy doping is going to apply.

Figure 7:
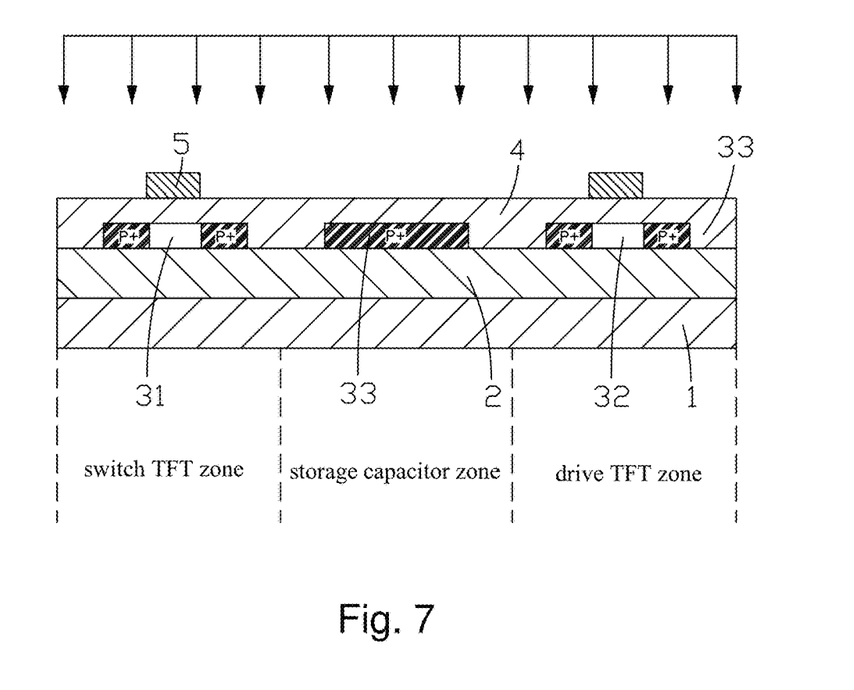

As shown in FIG. 7, with the photoresist layer 5 serving as a shielding layer, P-type heavy doping is applied to the first poly-silicon section 31, the second poly-silicon section 32, and the third poly-silicon section 33 so as to form P-type heavily doped (P+) zones respectively on two sides of each of the first poly-silicon section 31 and the second poly-silicon section 32 and the entirety of the third poly-silicon section 33.

Specifically, an ion implantation machine is employed to implant boron ions in order to form the P-type heavily doped (P+) zones.

Figure 8:
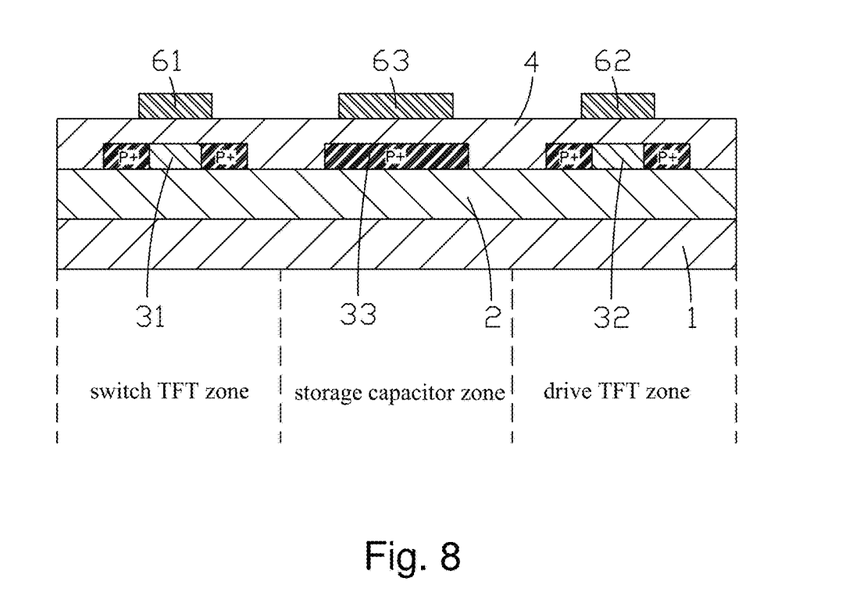
FIG. 8 is a schematic view illustrating a fifth step of the method for manufacturing the AMOLED backplane according to the present invention.

Step 5: as shown in FIG. 8, removing the photoresist layer 5, depositing a first metal layer on the gate insulation layer 4, and conducting a masking operation to patternize the first metal layer so as to form a first gate terminal 61 in the switch TFT zone, a second gate terminal 62 in the drive TFT zone, and a metal electrode 63 in the storage capacitor zone.

Specifically, the first metal layer, namely the first gate terminal 61, the second gate terminal 62, and the metal electrode 63, comprises a material of molybdenum (Mo).

Figure 9:
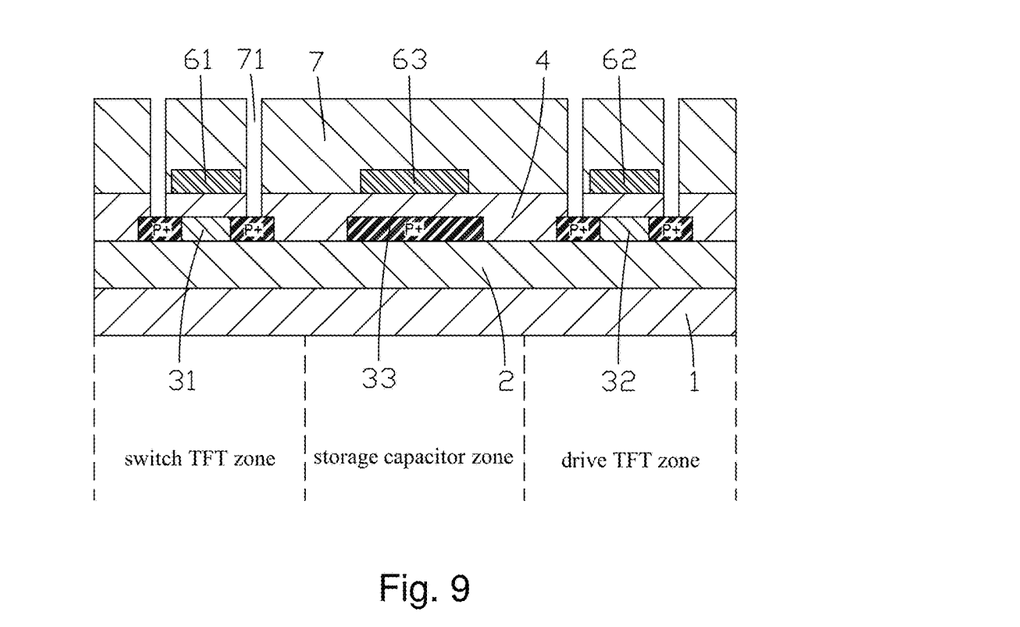
FIG. 9 is a schematic view illustrating a sixth step of the method for manufacturing the AMOLED backplane according to the present invention.

Step 6: as shown in FIG. 9, depositing an interlayer insulation layer 7 on the first gate terminal 61, the second gate terminal 62, the metal electrode 63, and the gate insulation layer 4 and conducting a masking operation to form first vias 71 in the interlayer insulation layer 7 and the gate insulation layer 4 to respectively correspond to the P-type heavily doped zones on the two sides of the first poly-silicon section 31 and those of the second poly-silicon section 32.

Specifically, the interlayer insulation layer 7 is a silicon oxide layer, a silicon nitride layer, or a composite structure composed of silicon oxide layers and silicon nitride layers.

Figure 10:
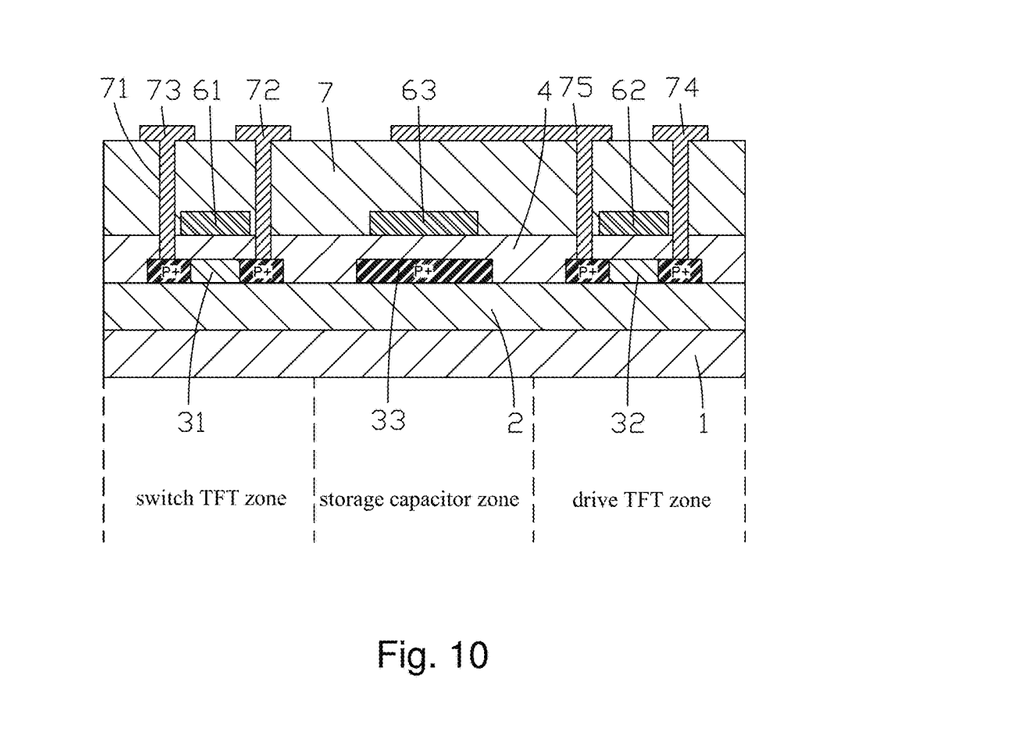
FIG. 10 is a schematic view illustrating a seventh step of the method for manufacturing the AMOLED backplane according to the present invention.

Step 7: as shown in FIG. 10, depositing a conductive film on the interlayer insulation layer 7 and conducting a masking operation to patternize the conductive film so as to form a first source terminal 72 and a first drain terminal 73 in the switch TFT zone and a second source terminal 74 and a second drain terminal 75 in the drive TFT zone, wherein the second drain terminal 75 is extended to the storage capacitor zone and also serves as an anode of the AMOLED.

The first source terminal 72, the first drain terminal 73, the second source terminal 74, and the second drain terminal 75 are respectively connected, through the first vias 71, to the P-type heavily doped (P+) zones on the two sides of the first poly-silicon section 31 and those of the second poly-silicon section 32.

Specifically, the conductive film, namely the first source terminal 72, the first drain terminal 73, the second source terminal 74, and the second drain terminal 75, has a structure that is a three-layer structure comprising a metal layer sandwiched between two conductive oxide layers. The conductive oxide layers comprise a material of indium tin oxide (ITO) and the metal layer comprises a material of silver (Ag) or aluminum (Al). The first poly-silicon section 31, the first gate terminal 61, the first source terminal 72, and the second drain terminal 73 constitute a switch TFT; the second poly-silicon section 32, the second gate terminal 62, the second source terminal 74, and the second drain terminal 75 constitute a drive TFT; and the third poly-silicon section 33 and the metal electrode 63 constitute a storage capacitor.

Figure 11:
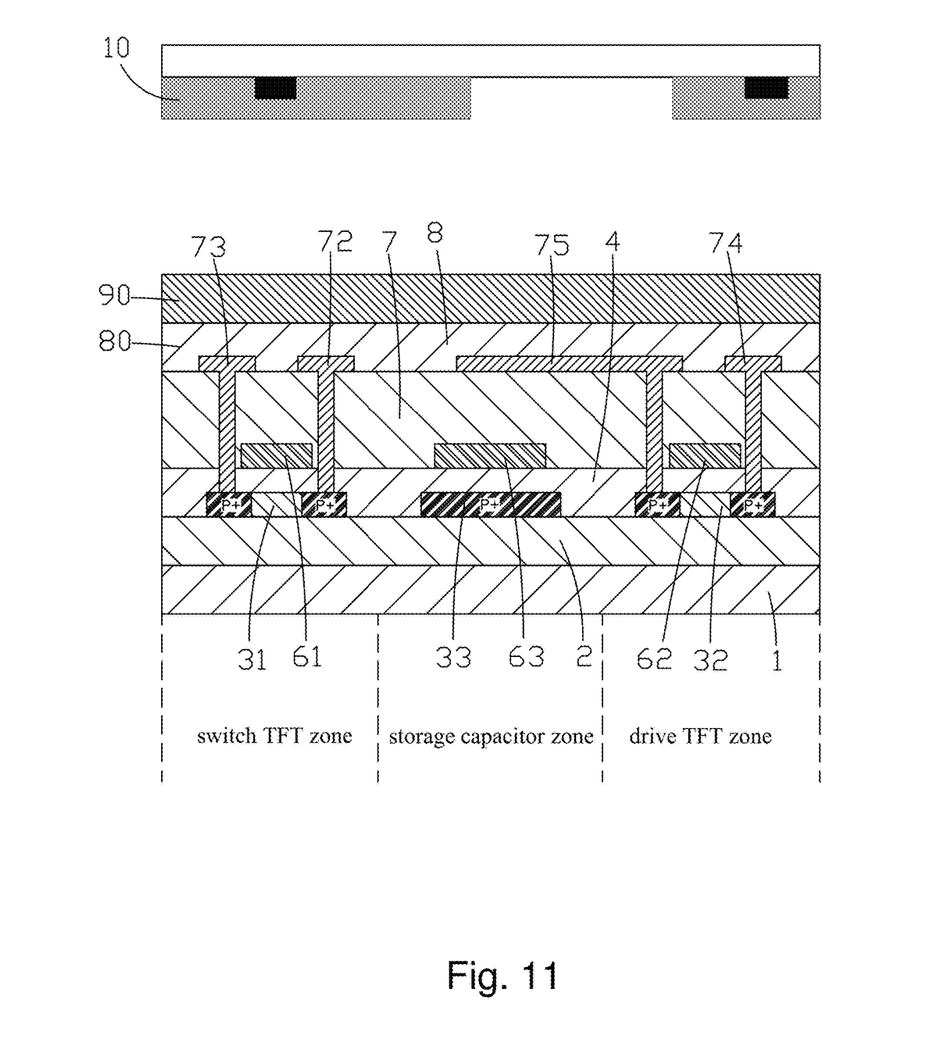
FIGS. 11 and 12 are schematic views illustrating an eighth step of the method for manufacturing the AMOLED backplane according to the present invention.
Figure 12:
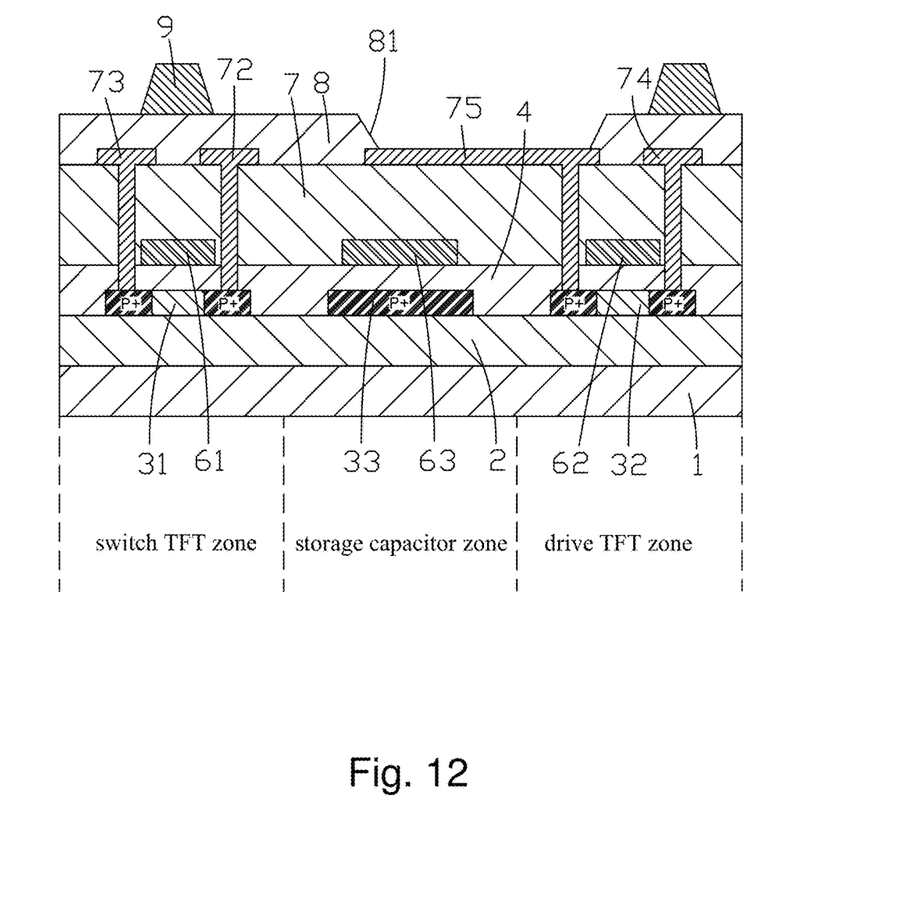

Step 8: as shown in FIGS. 11-12, sequentially depositing a second photoresist layer 80 and a third photoresist layer 90 on the first source terminal 72, the first drain terminal 73, the second source terminal 74, the second drain terminal 75, and the interlayer insulation layer 7 and conducting a half-tone masking operation to simultaneously subject the second photoresist layer 80 and the third photoresist layer 90 to patternization so as to form a pixel definition layer 8 and photo spacers 9, wherein the pixel definition layer 8 comprises a second via 81 formed therein to expose the second drain terminal 75.

Specifically, a specific process of the half-tone masking operation is as follows. Firstly, a photoresist layer is coated on the third photoresist layer 90 and a half-tone mask 10 is used to subject the photoresist layer to exposure and development. Then, second etching is applied to the second photoresist layer 80 and the third photoresist layer 90 to remove the residual parts of the photoresist layer thereby obtaining a patternized pixel definition layer 8 and photo spacers 9.

The above-described method for manufacturing an AMOLED backplane uses a drain terminal of a drive TFT to serve as an anode of the AMOLED, so that compared to the prior art, the steps of forming a planarization layer and an anode layer are eliminated and also, the same half-tone masking operation is used to form a pixel definition layer and photo spacers, whereby the method for manufacturing the AMOLED backplane according to the present invention requires only six masking operations and saves three masking operations compared to the prior art, thereby effectively simplifying the manufacturing process, improving manufacturing efficiency, and saving cost.

Referring to FIG. 12, a cross-sectional view is given to illustrate a structure of an AMOLED backplane according to the present invention. The present invention also provides a structure of an AMOLED backplane, which comprises a substrate 1, a buffer layer 2 formed on the substrate 1, a first poly-silicon section 31, a second poly-silicon section 32, and a third poly-silicon section 33 formed on the buffer layer 2 and spaced from each other, a gate insulation layer 4 formed on the first poly-silicon section 31, the second poly-silicon section 32, the third poly-silicon section 33, and the buffer layer 2, a first gate terminal 61, a second gate terminal 62, and a metal electrode 63 formed on the gate insulation layer 4, an interlayer insulation layer 7 formed on the first gate terminal 61, the second gate terminal 62, the metal electrode 63, and the gate insulation layer 4, a first source terminal 72, a first drain terminal 73, a second source terminal 74, and a second drain terminal 75 formed on the interlayer insulation layer 7, a pixel definition layer 8 formed on the first source terminal 72, the first drain terminal 73, the second source terminal 74, the second drain terminal 75, and the interlayer insulation layer 7, and photo spacers 9 formed on the pixel definition layer 8.

Specifically, the two sides of each the first poly-silicon section 31 and the second poly-silicon section 32 and the entirety of the third poly-silicon section 33 are each formed with a P-type heavily doped (P+) zone. Specifically, the interlayer insulation layer 7 and the gate insulation layer 4 comprise first vias 71 formed therein to correspond to the P-type heavily doped zones of the two sides of the first poly-silicon section 31 and the second poly-silicon section 32 so that the first source terminal 72, the first drain terminal 73, the second source terminal 74, and the second drain terminal 75 are respectively connected through the first vias 71 to the P-type heavily doped (P+) zones of the two sides of the first poly-silicon section 31 and the second poly-silicon section 32. The pixel definition layer 8 comprises a second via 81 formed therein to correspond to the second drain terminal 75 so as to expose the second drain terminal 75.

The first poly-silicon section 31, the first gate terminal 61, the first source terminal 72, and the first drain terminal 73 constitute a switch TFT; the second poly-silicon section 32, the second gate terminal 62, the second source terminal 74, and the second drain terminal 75 constitute a drive TFT; and the third poly-silicon section 33 and the metal electrode 63 constitute a storage capacitor. Also, the second drain terminal 75 serves as an anode of the AMOLED.

Specifically, the buffer layer 2 is a silicon oxide layer, a silicon nitride layer, or a composite structure composed of silicon oxide layers and silicon nitride layers.

Specifically, the gate insulation layer 4 is a silicon oxide layer, a silicon nitride layer, or a composite structure composed of silicon oxide layers and silicon nitride layers.

Specifically, the first gate terminal 61, the second gate terminal 62, and the metal electrode 63 comprise a material of molybdenum.

Specifically, the interlayer insulation layer 7 is a silicon oxide layer, a silicon nitride layer, or a composite structure composed of silicon oxide layers and silicon nitride layers.

Specifically, the first source terminal 72, the first drain terminal 73, the second source terminal 74, and the second drain terminal 75 are each of a three-layer structure comprising a metal layer sandwiched between two conductive oxide layers. The conductive oxide layers comprise a material of indium tin oxide and the metal layer comprises a material of silver or aluminum.

The above-described structure of the AMOLED backplane has a simple structure, is easy to manufacture, and has a low cost.

In summary, the present invention provides a method for manufacturing an AMOLED backplane, in which a drain terminal of a drive TFT also serves as an anode of the AMOLED, so that compared to the prior art, the steps of forming a planarization layer and an anode layer are eliminated and also, the same half-tone masking operation is used to form a pixel definition layer and photo spacers, whereby the method for manufacturing the AMOLED backplane according to the present invention requires only six masking operations and saves three masking operations compared to the prior art, thereby effectively simplifying the manufacturing process, improving manufacturing efficiency, and saving cost. The present invention provides a structure of an AMOLED backplane, which has a simple structure, is easy to manufacture, and has a low cost.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method for manufacturing an active matrix organic light emitting diode (AMOLED) backplane, comprising the following steps:

(1) providing a substrate, wherein the substrate comprises a switch thin-film transistor (TFT) zone, a storage capacitor zone, and a drive TFT zone, and depositing a buffer layer on the substrate;

(2) depositing an amorphous silicon layer on the buffer layer, conducting a crystallization process to crystallize and convert the amorphous silicon layer into a poly-silicon layer, and conducting a masking operation to subject the poly-silicon layer to patterning so as to form a first polysilicon section located in the switch TFT zone, a second polysilicon section located in the drive TFT zone, and a third polysilicon section located in the storage capacitor zone;

(3) depositing a gate insulation layer on the first polysilicon section, the second polysilicon section, the polysilicon section, and the buffer layer;

(4) depositing a first photoresist layer on the gate insulation layer and conducting a masking operation to pattern the first photoresist layer so as to form a photoresist layer, wherein the photoresist layer shields middle portions of the first polysilicon section and the second polysilicon section but does not shield the third polysilicon section, wherein with the photoresist layer serving as a shielding layer, P-type heavy doping is applied to the first poly-silicon section, the second polysilicon section, and the third polysilicon section so as to form P-type heavily doped zones respectively on two sides of each of the first polysilicon section and the second polysilicon section and an entirety of the third polysilicon section;

(5) removing the photoresist layer, depositing a first metal layer on the gate insulation layer, and conducting a masking operation to pattern the first metal layer so as to form a first gate terminal in the switch TFT zone, a second gate terminal in the drive TFT zone, and a metal electrode in the storage capacitor zone;

(6) depositing an interlayer insulation layer on the first gate terminal, the second gate terminal, the metal electrode, and the gate insulation layer and conducting a masking operation to form first vias in the interlayer insulation layer and the gate insulation layer to respectively correspond to the P-type heavily doped zones on the two sides of the first polysilicon section and those of the second polysilicon section;

(7) depositing a conductive film on the interlayer insulation layer and conducting a masking operation to pattern the conductive film so as to form a first source terminal and a first drain terminal in the switch TFT zone and a second source terminal and a second drain terminal in the drive TFT zone, wherein the second drain terminal is extended to the storage capacitor zone and also serves as an anode of the AMOLED, wherein the first source terminal, the first drain terminal, the second source terminal, and the second drain terminal are respectively connected, through the first vias, to the P-type heavily doped zones on the two sides of the first polysilicon section and those of the second polysilicon section;

wherein the anode of the AMOLED and the first source terminal, the first drain terminal, the second source terminal, and the second drain terminal are collectively located on and in direct contact with a surface of the interlayer insulation layer such that the anode of the AMOLED and the first source terminal, the first drain terminal, the second source terminal, and the second drain terminal are all located on a common plane defined by the surface of the interlayer insulation layer; and (8) sequentially depositing a second photoresist layer and a third photoresist layer on the first source terminal, the first drain terminal, the second source terminal, the second drain terminal, and the interlayer insulation layer and conducting a half-tone masking operation to simultaneously subject the second photoresist layer and the third photoresist layer to patterning so as to form a pixel definition layer and photo spacers, wherein the pixel definition layer comprises a second via formed therein to expose the second drain terminal.

2. The method for manufacturing the AMOLED backplane as claimed in claim 1, wherein in step (2), the crystallization process is performed with excimer laser annealing, solid phase crystallization, metal-induced crystallization, or metal-induced lateral crystallization.

3. The method for manufacturing the AMOLED backplane as claimed in claim 1, wherein in step (3), the gate insulation layer is formed of a silicon oxide layer, a silicon nitride layer, or a composite structure composed of silicon oxide layers and silicon nitride layers.

4. The method for manufacturing the AMOLED backplane as claimed in claim 1, wherein in step (5), an ion implantation machine is employ to implant boron ions to form the P-type heavily doped zones.

5. The method for manufacturing the AMOLED backplane as claimed in claim 1, wherein in step (7), the interlayer insulation layer is formed of a silicon oxide layer, a silicon nitride layer, or a composite structure composed of silicon oxide layers and silicon nitride layers.

6. The method for manufacturing the AMOLED backplane as claimed in claim 1, wherein in step (8), the conductive film, and thus the first source terminal, the first drain terminal, the second source terminal, and the second drain terminal, is of a three-layer structure comprising a metal layer sandwiched between two conductive oxide layers, the conductive oxide layers comprise a material of indium tin oxide, the metal layer comprises a material of silver or aluminum.

7. A structure of an active matrix organic light emitting diode (AMOLED) backplane, comprising:
a substrate;
a buffer layer formed on the substrate;
a first polysilicon section, a second polysilicon section, and a third polysilicon section formed on the buffer layer and spaced from each other;
a gate insulation layer formed on the first polysilicon section, the second polysilicon section, the third polysilicon section, and the buffer layer;
a first gate terminal, a second gate terminal, and a metal electrode formed on the gate insulation layer;
an interlayer insulation layer formed on the first gate terminal, the second gate terminal, the metal electrode, and the gate insulation layer;
a first source terminal, a first drain terminal, a second source terminal, and a second drain terminal formed on the interlayer insulation layer;
a pixel definition layer formed on the first source terminal, the first drain terminal, the second source terminal, the second drain terminal, and the interlayer insulation layer; and
photo spacers formed on the pixel definition layer;
wherein two sides of each of the first polysilicon section and the second polysilicon section and an entirety of the third polysilicon section are each formed with a P-type heavily doped zone;
wherein the interlayer insulation layer and the gate insulation layer comprise first vias formed therein to correspond to the P-type heavily doped zones of the two sides of the first polysilicon section and the second polysilicon section so that the first source terminal, the first drain terminal, the second source terminal, and the second drain terminal are respectively connected through the first vias to the P-type heavily doped zones of the two sides of the first polysilicon section and the second polysilicon section; and the pixel definition layer comprises a second via formed therein to correspond to the second drain terminal so as to expose the second drain terminal;
wherein the first polysilicon section, the first gate terminal, the first source terminal, and the first drain terminal constitute a switch TFT; the second polysilicon section, the second gate terminal, the second source terminal, and the second drain terminal constitute a drive TFT; and the third polysilicon section and the metal electrode constitute a storage capacitor; and the second drain terminal serves as an anode of the AMOLED; and
wherein the anode of the AMOLED and the first source terminal, the first drain terminal, the second source terminal, and the second drain terminal are collectively located on and in direct contact with a surface of the interlayer insulation layer such that the anode of the AMOLED and the first source terminal, the first drain terminal, the second source terminal, and the second drain terminal are all located on a common plane defined by the surface of the interlayer insulation layer.

8. The structure of the AMOLED backplane as claimed in claim 7, wherein the gate insulation layer comprises a silicon oxide layer, a silicon nitride layer, or a composite structure composed of silicon oxide layers and silicon nitride layers.

9. The structure of the AMOLED backplane as claimed in claim 7, wherein the interlayer insulation layer comprises a silicon oxide layer, a silicon nitride layer, or a composite structure composed of silicon oxide layers and silicon nitride layers.

10. The structure of the AMOLED backplane as claimed in claim 7, wherein the first source terminal, the first drain terminal, the second source terminal, and the second drain terminal are each of three-layer structure comprising a metal layer sandwiched between two conductive oxide layers, the conductive oxide layers comprising a material of indium tin oxide, the metal layer comprising a material of silver or aluminum.

11. A structure of an active matrix organic light emitting diode (AMOLED) backplane, comprising:
   a substrate;
   a buffer layer formed on the substrate;
   a first polysilicon section, a second polysilicon section, and a third polysilicon section formed on the buffer layer and spaced from each other;
   a gate insulation layer formed on the first polysilicon section, the second polysilicon section, the third polysilicon section, and the buffer layer;
   a first gate terminal, a second gate terminal, and a metal electrode formed on the gate insulation layer;
   an interlayer insulation layer formed on the first gate terminal, the second gate terminal, the metal electrode, and the gate insulation layer;
   a first source terminal, a first drain terminal, a second source terminal, and a second drain terminal formed on the interlayer insulation layer;
   a pixel definition layer formed on the first source terminal, the first drain terminal, the second source terminal, the second drain terminal, and the interlayer insulation layer; and
   photo spacers formed on the pixel definition layer;
   wherein two sides of each of the first polysilicon section and the second polysilicon section and an entirety of the third polysilicon section are each formed with a P-type heavily doped zone;
   wherein the interlayer insulation layer and the gate insulation layer comprise first vias formed therein to correspond to the P-type heavily doped zones of the two sides of the first polysilicon section and the second polysilicon section so that the first source terminal, the first drain terminal, the second source terminal, and the second drain terminal are respectively connected through the first vias to the P-type heavily doped zones of the two sides of the first polysilicon section and the second polysilicon section; and the pixel definition layer comprises a second via formed therein to correspond to the second drain terminal so as to expose the second drain terminal;
   wherein the first polysilicon section, the first gate terminal, the first source terminal, and the first drain terminal constitute a switch TFT; the second polysilicon section, the second gate terminal, the second source terminal, and the second drain terminal constitute a drive TFT; and the third polysilicon section and the metal electrode constitute a storage capacitor; and the second drain terminal serves as an anode of the AMOLED;
   wherein the anode of the AMOLED and the first source terminal, the first drain terminal, the second source terminal, and the second drain terminal are collectively located on and in direct contact with a surface of the interlayer insulation layer such that the anode of the AMOLED and the first source terminal, the first drain terminal, the second source terminal, and the second drain terminal are all located on a common plane defined by the surface of the interlayer insulation layer;
   wherein the gate insulation layer comprises a silicon oxide layer, a silicon nitride layer, or a composite structure composed of silicon oxide layers and silicon nitride layers;
   wherein the interlayer insulation layer comprises a silicon oxide layer, a silicon nitride layer, or a composite structure composed of silicon oxide layers and silicon nitride layers; and
   wherein the first source terminal, the first drain terminal, the second source terminal, and the second drain terminal are each of a three-layer structure comprising a metal layer sandwiched between two conductive oxide layers, the conductive oxide layers comprising a material of indium tin oxide, the metal layer comprising a material of silver or aluminum.

* * * * *